(12) United States Patent
Ju

(10) Patent No.: US 7,351,074 B2
(45) Date of Patent: Apr. 1, 2008

(54) STRUCTURE OF CIRCUIT BOARD

(75) Inventor: Ted Ju, Keelung (TW)

(73) Assignee: Lotes Co., Ltd, Keelung (TW)

( * ) Notice: Subject to any disclaimer, the term of this patent is extended or adjusted under 35 U.S.C. 154(b) by 0 days.

(21) Appl. No.: 11/542,260

(22) Filed: Oct. 4, 2006

(65) Prior Publication Data
US 2007/0249186 A1 Oct. 25, 2007

(30) Foreign Application Priority Data
Apr. 25, 2006 (CN) .................. 2006 2 0058203 U

(51) Int. Cl.
H01R 12/00 (2006.01)
(52) U.S. Cl. .................. 439/83; 439/877; 361/777; 361/230
(58) Field of Classification Search ............ 439/82–83, 439/71, 877; 361/777, 230
See application file for complete search history.

(56) References Cited
U.S. PATENT DOCUMENTS
5,875,102 A * 2/1999 Barrow ................ 361/777

* cited by examiner

Primary Examiner—Truc Nguyen
(74) Attorney, Agent, or Firm—Birch, Stewart, Kolasch & Birch, LLP

(57) ABSTRACT

An improved structure of circuit board, according to the present invention, involves sealing a conductive passageway on a circuit board by use of a spacer disposed in a solder paste. A welding pad is disposed on the conductive passageway so that an electrical terminal is capable of being soldered into the conductive passageway directly. The improved structure of circuit board is capable of stopping the solder paste from entering into the conductive passageway, thus shortening the electrical wiring pathway between the electrical terminal and the circuit board effectively, so as to improve the electrical conductivity between the electrical terminal and the printed circuit board.

10 Claims, 3 Drawing Sheets

STRUCTURE OF CIRCUIT BOARD

BACKGROUND OF THE INVENTION

1. Field of the Invention

The present invention relates to an improved structure of a circuit board.

2. Description of the Prior Art

A printed circuit board (PCB) is a thin piece formed from insulating material, such as plastic, onto which electrical wiring pathways or traces have been printed, usually by a photo-engraving process; furthermore, several conductive passageways have been formed for conducting with the traces, and electrical parts like integrated circuits and resistors are then installed thereon. This kind of printed circuit board presently serves as a commonly used technology in constructing electronic units, such as a motherboard or an interface card.

In the electrical connector industry, electrical terminals are generally soldered onto the printed circuit board by use of solder, and each of the electrical terminals corresponds to a conductive passageway. However, in the current technology, the electrical terminal is not soldered into the conductive passageways directly, but onto a welding pad separated from the conductive passageway. Additionally, a trace is located between the welding pad on which the electrical terminal is soldered and the conductive passageway on the printed circuit board, so as to electrically connect the electrical terminal and the printed circuit board. However, in the soldering process, the electrical terminal is apart from the conductive passageway, and the electrical terminal is not in contact with the conductive passageway directly. Consequently, the electrical conductivity between the electrical terminal and the printed circuit board is affected. Besides, the practical operation is not convenient.

Accordingly, it is necessary to design a new type of printed circuit board to overcome the drawbacks mentioned above.

SUMMARY OF THE INVENTION

A scope of the present invention is to provide an improved structure of a circuit board that has at least one spacer.

To achieve the objective discussed above, the improved circuit board structure, according to the present invention, provides at least one welding pad. The welding pad thereon has at least one conductive passageway, and the circuit board structure also provides at least one spacer to seal the conductive passageway, so as to stop the solder paste from entering into the conductive passageway.

Compared with the prior art, the circuit board structure, according to the invention, includes the spacer in the solder paste. The spacer disposed in the solder paste is capable of sealing the conductive passageway in advance and stopping the solder paste from entering into the conductive passageway. Additionally, the welding pad is disposed on the conductive passageway, so that the electrical terminal can be soldered into the conductive passageway directly. Accordingly, the electrical wiring pathway is shortened effectively, so as to improve the electrical conductivity between the electrical terminal and the printed circuit board.

BRIEF DESCRIPTION OF THE APPENDED DRAWINGS

DETAILED DESCRIPTION OF THE INVENTION

Figure 1:
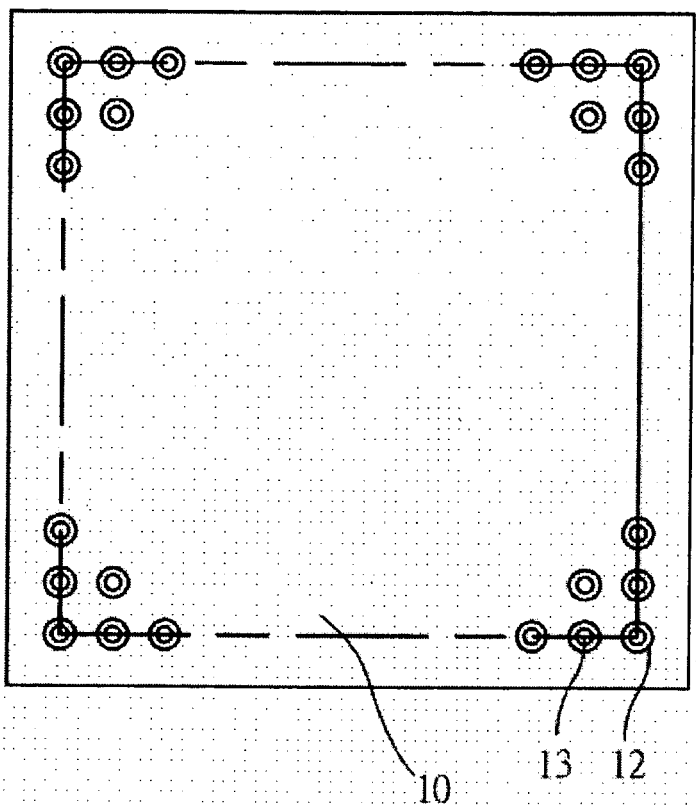
FIG. 1 is a schematic diagram of the improved circuit board structure according to the present invention.
Figure 2:
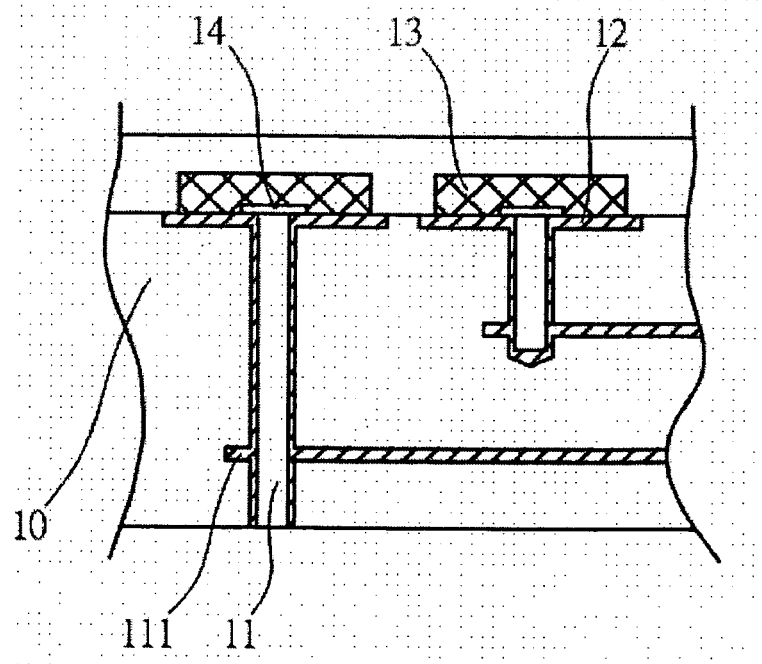
FIG. 2 is a partial cross-sectional view of the improved circuit board structure shown in FIG. 1.
Figure 3:
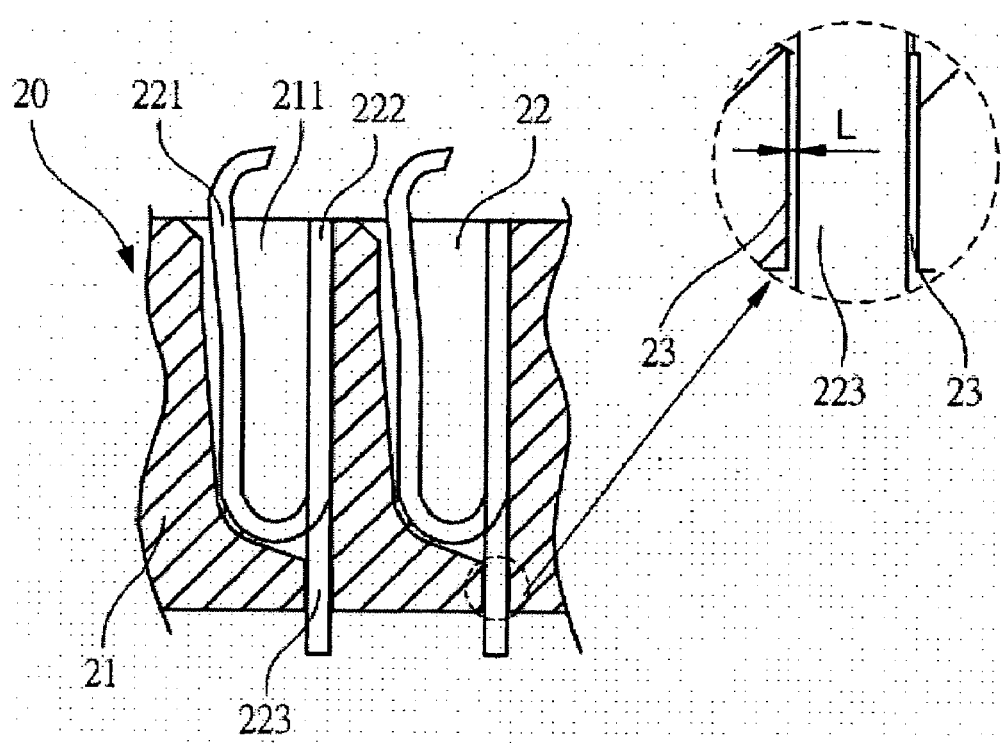
FIG. 3 is a partial cross-sectional view illustrating the electrical terminal inserted in the solder paste.
Figure 4:
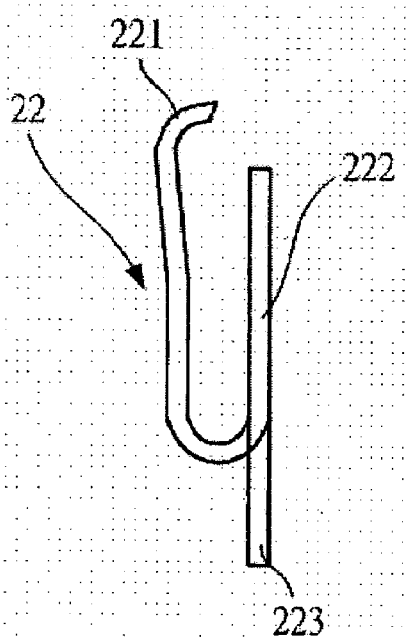
FIG. 4 is a schematic diagram of the electrical terminal.

Figures and the embodiments are described below to provide a more detailed description about the present invention.

Referring to FIGS. 1 to 5, the improved circuit board structure, according to the invention, includes a circuit board 10 and several conductive passageways 11 disposed on the circuit board 10. A conductive material 111 is coated in each of the conductive passageways 11. A welding pad 12 is disposed on the top of each conductive passageway 11. A solder paste 13 is applied onto each welding pad 12, and a respective spacer 14 is disposed in the solder paste 13, and the spacer 14 is disposed onto the surface of the welding pad 12. The spacer 14 can seal the conductive passageway 11, so as to stop the solder paste from entering into the conductive passageway 11; usually the spacer 14 is formed from solder mask. The diameter of the spacer 14 is not shorter than the diameter of the conductive passageway 11. Additionally, part of the spacer 14 is filled into the conductive passageway 11.

Figure 5:
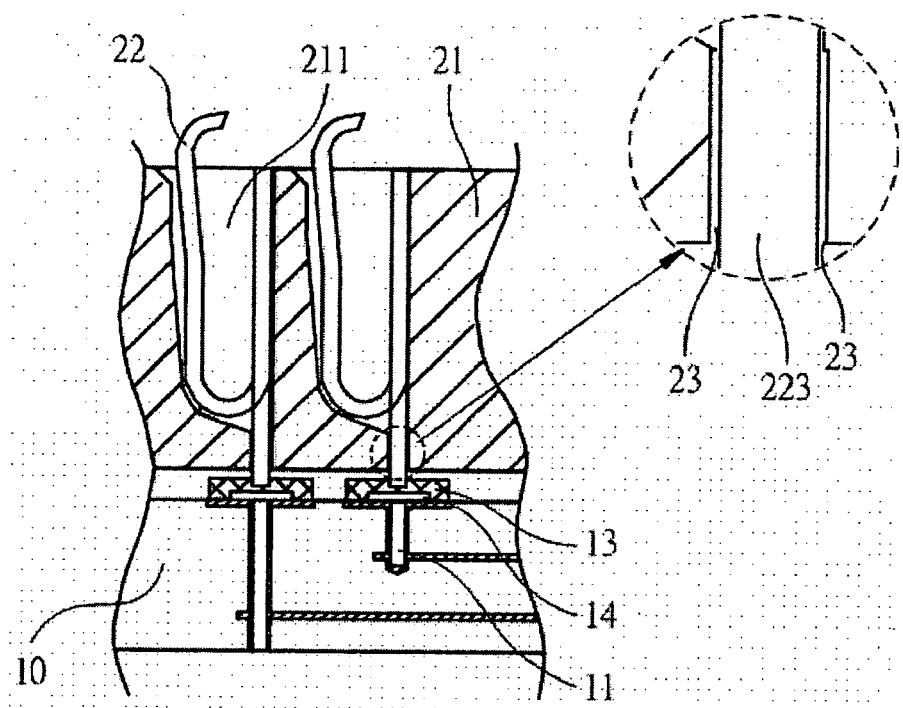
FIG. 5 is a partial cross-sectional view illustrating the electrical terminal stuck on the printed circuit board.

An electrical connector 20 capable of being fastened onto the circuit board 10 includes an insulative housing 21 and at least one electrical terminal 22. The insulative housing 21 has cavities 211 for receiving the electrical terminal 22. The electrical terminal 22 includes an elastic arm 221 and a connective arm 222, and the elastic arm may be pushed against the inner wall of the cavity 211. The connective arm 222 extends outward to form a conductive portion 223. The connective portion 223 can be soldered onto the circuit board 10, so that it is fastened on the circuit board 10. A respective tight fit region 23 is disposed at where the conductive portion 223 and the cavity 221 connect. Additionally, the length between the outer wall of the tight fit region 23 and the conductive portion 223 is not longer than 0.02 mm. As shown in FIG. 5, the length L between the outer wall of the tight fit region 23 and the conductive portion 223 is not longer than 0.02 mm, and the tight fit region 23 leads into the bottom of the cavity 211.

The steps for soldering the electrical terminal 22 onto the circuit board 10 is first to fasten one end of the electrical terminal 22 into the insulating housing 21. The next step is to insert the conductive portion 223 into the solder paste 13 and then the solder paste 13 is melted, so as to fasten the conductive portion 223 in the solder paste 13. Because the tight fit region 23 is disposed inside the insulating housing 21, and the diameter of the tight fit region 23 is short enough, the tight fit region 23 is capable of effectively stopping the solder paste 13 entering into the cavity 221 due to the Capillary siphoning phenomenon while the solder paste 13 is melt. Furthermore, the diameter of the tight fit region is not longer than 0.02 mm. Additionally, the spacer 14 disposed inside the solder paste 13 is also capable of stopping the solder paste 13 entering into the conductive passageway 11.

Figure 6:
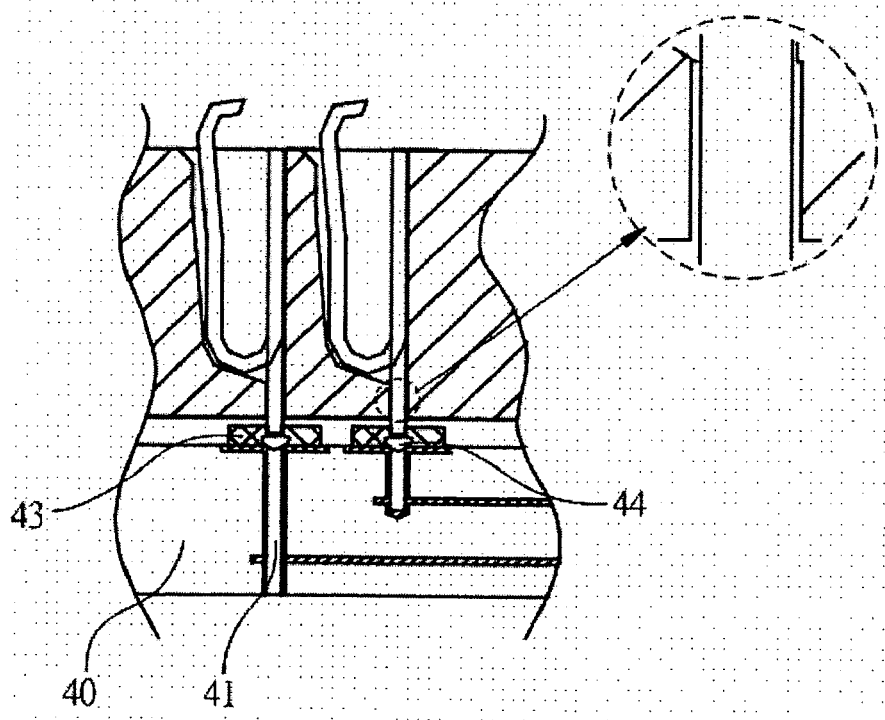
FIG. 6 is a partial cross-sectional view illustrating the electrical terminal stuck on the printed circuit board for the second embodiment according to the present invention.

FIG. 6 illustrates the second embodiment of the improved circuit board structure according to the present invention. In the embodiment, the spacers 44 on the circuit board 40 are solder balls. The melting point of the solder balls 44 is higher than the solder pastes 43. Each solder ball 44 is filled into the conductive passageway 41. While the connective portion of the electrical terminal is soldered to fasten onto the circuit board 40, the solder ball 44 is capable of stopping the solder paste 43 entering into the conductive passageway 41 of the circuit board 40 because the melting point of the solder ball 44 is higher than the melting point of the solder paste 43, and the solder ball 44 is filled into the conductive passageway 41.

In the improved circuit board structure according to the present invention, the spacer is disposed inside the solder paste. The spacer is capable of blocking up the conductive passageway in advance, so as to effectively stopping the solder paste entering into the conductive passageway. Additionally, the welding pad is disposed on the conductive passageway, so that the electrical terminal can be soldered into the conductive passageway so as to shorten the electrical wiring pathway and benefit the electrical conductivity between the electrical terminal and the circuit board.

With the recitations of the preferred embodiment above, the features and spirits of the invention will hopefully be well described. However, the scope of the invention is not restricted by the preferred embodiment disclosed above. The objective is that all alternative and equivalent arrangements are hopefully covered in the scope of the appended claims of the invention. Accordingly, the above disclosure should be construed as limited only by the metes and bounds of the appended claims.

What is claimed is:

1. An improved circuit board structure for connecting with an electrical connector, wherein said circuit board structure thereon provides at least one welding pad where each of the conductive terminal of the electrical connector is capable of being soldered by use of a solder paste, the welding pad thereon has at least one conductive passageway, said circuit board structure thereon also provides at least one spacer to seal the conductive passageway and to stop the solder paste from entering into the conductive passageway during the soldering of the electrical connector, and the spacer is a solder ball.

2. The improved circuit board structure of claim 1, wherein the spacer is disposed on the surface of the welding pad.

3. The improved circuit board structure of claim 1, wherein the diameter of the spacer is not shorter than the diameter of the conductive passageway.

4. The improved circuit board structure of claim 1, wherein part of the spacer is partially filled into each of the conductive passageway.

5. The improved circuit board structure of claim 1, wherein the spacer is formed from solder mask.

6. The improved circuit board structure of claim 1, wherein the melting point of the solder ball is higher than the melting point of the solder paste.

7. The improved circuit board structure of claim 1, wherein each of the electrical terminals is inserted into the solder paste, and each electrical terminal corresponds to least one conductive passageway.

8. The improved circuit board structure of claim 1, wherein the electrical connector comprises respectively an insulative housing and at least one electrical terminal, the insulative housing has cavities for receiving the electrical terminals, each of the electrical terminals comprises a respective conductive portion capable of connecting to the circuit board structure, and each of the cavities therein has a tight fit region respectively where the conductive portion attaches to the cavity.

9. The improved circuit board structure of claim 8, wherein the length between the wall of the tight fit region and the conductive portion of each of the electricalterminal is not longer than 0.02 mm.

10. The improved circuit board structure of claim 1, wherein each of the electrical terminals comprises a respective elastic arm and a respective connective arm, said connective arm extends outward to form a conductive portion.

* * * * *